(12) United States Patent
Yi

(10) Patent No.: US 12,191,293 B2
(45) Date of Patent: Jan. 7, 2025

(54) DISPLAY DEVICE AND METHOD FOR FABRICATING SAME

(71) Applicant: WUHAN CHINA STAR OPTOELECTRONICS SEMICONDUCTOR DISPLAY TECHNOLOGY CO., LTD., Hubei (CN)

(72) Inventor: Shijuan Yi, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 0 days.

(21) Appl. No.: 17/623,203

(22) PCT Filed: Dec. 16, 2021

(86) PCT No.: PCT/CN2021/138928
§ 371 (c)(1),
(2) Date: Dec. 27, 2021

(87) PCT Pub. No.: WO2023/103022
PCT Pub. Date: Jun. 15, 2023

(65) Prior Publication Data
US 2024/0030231 A1    Jan. 25, 2024

(30) Foreign Application Priority Data
Dec. 10, 2021 (CN) .......................... 202111508895.6

(51) Int. Cl.
*H01L 25/16* (2023.01)
*H01L 25/075* (2006.01)
(Continued)

(52) U.S. Cl.
CPC ........ *H01L 25/167* (2013.01); *H01L 25/0753* (2013.01); *H01L 27/124* (2013.01); *H01L 27/156* (2013.01)

(58) Field of Classification Search
CPC . H01L 25/167; H01L 25/0753; H01L 27/156; H01L 27/124
See application file for complete search history.

(56) References Cited

U.S. PATENT DOCUMENTS

| 2019/0006389 A1 | 1/2019 | Wang et al. |
| 2021/0225823 A1* | 7/2021 | Liang .................... H01L 25/167 |
| 2022/0020907 A1* | 1/2022 | Yuan ................... H01L 25/0753 |

FOREIGN PATENT DOCUMENTS

| CN | 103855179 A | 6/2014 |
| CN | 107425041 A | 12/2017 |

(Continued)

OTHER PUBLICATIONS

International Search Report in International application No. PCT/CN2021/138928, mailed on Jul. 28, 2022.
(Continued)

*Primary Examiner* — Peter M Albrecht
(74) *Attorney, Agent, or Firm* — PV IP PC; Wei Te Chung

(57) ABSTRACT

A display device and a method for fabricating the same are provided. The display device includes a support substrate, a light-emitting chip, and a thin film transistor. The light-emitting chip is disposed on a side of the support substrate. The thin film transistor is disposed on a side of the light-emitting chip away from the support substrate. The thin film transistor is connected to the light-emitting chip.

20 Claims, 4 Drawing Sheets

(51) Int. Cl.
    *H01L 27/12*     (2006.01)
    *H01L 27/15*     (2006.01)

(56) References Cited

FOREIGN PATENT DOCUMENTS

| | | |
|---|---|---|
| CN | 108183117 A | 6/2018 |
| CN | 108493209 A | 9/2018 |
| CN | 109300408 A | 2/2019 |
| CN | 109427843 A | 3/2019 |
| CN | 110459568 A | 11/2019 |
| CN | 111668242 A | 9/2020 |
| CN | 113571541 A | 10/2021 |
| KR | 20130137985 A | 12/2013 |

OTHER PUBLICATIONS

Written Opinion of the International Search Authority in International application No. PCT/CN2021/138928, mailed on Jul. 28, 2022.

Chinese Office Action issued in corresponding Chinese Patent Application No. 202111508895.6 dated Jan. 18, 2023, pp. 1-7.

\* cited by examiner

DISPLAY DEVICE AND METHOD FOR FABRICATING SAME

BACKGROUND OF INVENTION

1. Field of Invention

The present invention relates to a technical field of displays, and more particularly to a display device and a method for fabricating the same.

2. Related Art

Micro-light-emitting diode (micro-LED) and mini light-emitting diode (Mini-LED) chip displays (collectively: MLED) are composed of a micron-level semiconductor light-emitting unit array, which is a comprehensive technology that combines new display technology and light-emitting diode technology. The MLED display has the advantages of self-luminescence, high efficiency, low power consumption, high integration, high stability, and all-weather work. It is considered to be one of the most promising next-generation displays. In addition, due to its small size, high flexibility, and easy disassembly and merging, MLED can be deployed in any existing display application from the smallest to the largest size. In many cases, the micro-LED displays will play a more unique effect than liquid crystal displays (LCD) and organic light-emitting diode (OLED) displays. In the future, the Micro-LED display technology will also expand from flat panel display to augmented reality/virtual reality/mixed reality (AR/VR/MR), spatial display, flexible display, transparent display, wearable/implantable optoelectronic devices, optical communication and interconnection, medical detection, smart car lights, and many other fields. If a breakthrough is made in quantitative production technology, the Micro-LED display is highly likely to become a disruptive and transformative next-generation mainstream display technology, bringing a new round of display technology upgrades.

At present, the structure of a common micro-LED display device from bottom to top is: a thin film transistor array substrate, a MLED light-emitting chip, an encapsulation layer, and a cover plate. The fabricating process of this kind of MLED display device is as follows: firstly, the driven array substrate is manufactured, the MLED devices on the wafer are transferred to the thin film transistor array substrate, and then the module manufacturing process is performed. The massive transfer of MLED chips is generally bonded by anisotropic conductive film (ACF), or metal bonding that can form an alloy at low temperature. These bonding processes are not only difficult, but also the bonding strength between the MLED light-emitting chip and the thin film transistor array substrate is low, resulting in a low process yield.

SUMMARY OF INVENTION

The present application provides a display device, which can reduce the difficulty of a manufacturing process, improve bonding strength of a light-emitting chip and a thin film transistor array, thereby improving a process yield.

The application provides a display device including: a support substrate; a light-emitting chip disposed on a side of the support substrate; and a thin film transistor disposed on a side of the light-emitting chip away from the support substrate and connected to the light-emitting chip.

In one embodiment, the display device comprises a first signal transmission electrode disposed on the side of the light-emitting chip away from the support substrate, the light-emitting chip comprises a first electrode and a second electrode, the first electrode is located on a side of the second electrode away from the support substrate, the thin film transistor comprises a source and a drain, the source is connected to the first signal transmission electrode, and the drain is connected to the first electrode.

In one embodiment, the first signal transmission electrode is disposed on a side of the thin film transistor away from the light-emitting chip, the display device comprises a first drive electrode disposed on the side of the light-emitting chip away from the support substrate, arranged spaced apart from the thin film transistor, and connected between the drain and the first electrode.

In one embodiment, the first drive electrode is arranged in the same layer as the drain and directly connected to the drain.

In one embodiment, the display device further comprises a bridging electrode arranged in the same layer as a VDD, and connecting the drain and the first drive electrode.

In one embodiment, the thin film transistor further comprises a first gate and a second gate disposed on a side of the first gate away from the light-emitting chip, the source and the drain are disposed on a side of the second gate away from the light-emitting chip, the first signal transmission electrode and the source are arranged in the same layer, and the first signal transmission electrode is connected between the source and the second gate.

In one embodiment, the display device comprises a second signal transmission electrode disposed on the side of the light-emitting chip away from the support substrate, and connected to the second electrode.

In one embodiment, the second signal transmission electrode is disposed on a side of the thin film transistor away from the light-emitting chip; or the second signal transmission electrode and the source electrode are arranged in the same layer.

In one embodiment, the display device comprises a second drive electrode disposed on a side of the light-emitting chip close to the support substrate, and connected between the second signal transmission electrode and the second electrode.

In one embodiment, the display device comprises a connecting electrode connected between the second signal transmission electrode and the second drive electrode.

In one embodiment, the second drive electrode is disposed corresponding to the second electrode and is a transparent electrode, the display device comprises a metal electrode disposed between the support substrate and the light-emitting chip and provided with an opening, the second drive electrode is disposed in the opening and electrically connected to the metal electrode, and the display device comprises a connecting electrode connected between the second signal transmission electrode and the metal electrode.

In one embodiment, the thin film transistor comprises an active layer having an orthographic projection overlapping with the metal electrode on a plane where the metal electrode is located.

In one embodiment, the second signal transmission electrode and the first signal transmission electrode are arranged in the same layer.

In one embodiment, the display device comprises a second signal transmission electrode disposed on the side of the light-emitting chip away from the support substrate and connected to the second electrode; the second signal transmission electrode is disposed on the side of the thin film transistor away from the light-emitting chip; or the second signal transmission electrode and the source are arranged in the same layer.

In one embodiment, the display device comprises a second drive electrode, a connecting electrode and a metal electrode, the second drive electrode is disposed on a side of the light-emitting chip close to the support substrate, the second drive electrode is connected between the second signal transmission electrode and the second electrode, disposed corresponding to the second electrode, and is a transparent electrode; the connecting electrode is connected between the second signal transmission electrode and the second drive electrode; the metal electrode is disposed between the support substrate and the light-emitting chip and provided with an opening, and the second drive electrode is disposed in the opening and is electrically connected to the metal electrode.

In one embodiment, the display device comprises a second signal transmission electrode disposed on the side of the light-emitting chip away from the support substrate and connected to the second electrode; the second signal transmission electrode is disposed on the side of the thin film transistor away from the light-emitting chip; or the second signal transmission electrode and the source electrode are arranged in the same layer.

In one embodiment, the display device comprises a second signal transmission electrode disposed on the side of the light-emitting chip away from the support substrate and connected to the second electrode; the second signal transmission electrode is disposed on the side of the thin film transistor away from the light-emitting chip; or the second signal transmission electrode and the source electrode are arranged in the same layer.

In one embodiment, the display device comprises a second drive electrode, a connecting electrode and a metal electrode, the second drive electrode is disposed on a side of the light-emitting chip close to the support substrate, the second drive electrode is connected between the second signal transmission electrode and the second electrode, disposed corresponding to the second electrode, and is a transparent electrode; the connecting electrode is connected between the second signal transmission electrode and the second drive electrode; the metal electrode is disposed between the support substrate and the light-emitting chip and provided with an opening, and the second drive electrode is disposed in the opening and is electrically connected to the metal electrode. In one embodiment, the display device comprises a flat layer disposed between the light-emitting chip and the thin film transistor and encapsulating the light-emitting chip.

In one embodiment, the display device further comprises a drive component disposed on a side of the thin film transistor away from the light-emitting chip and connected to the thin film transistor.

The present application has advantageous effects as follows: the display device of the present application may form the light-emitting chip on the support substrate, and then use a photolithography process to form a thin film transistor for driving on the light-emitting chip. Compared with the prior art, the display device of the present application does not need to use anisotropic conductive film bonding process or metal bonding process, only through the photolithography process instead, to firmly bond the light-emitting chip and a thin film transistor array support substrate, which improves the bonding stability and thus the process yield.

BRIEF DESCRIPTION OF DRAWINGS

In order to describe the technical solutions more clearly in the embodiments of the present application, the following will briefly introduce the drawings used in the description of the embodiments. The drawings in the following description are only some embodiments of the present application. As far as technical personnel are concerned, they can obtain other drawings based on these drawings without creative work.

DESCRIPTION OF PREFERRED EMBODIMENTS

Figure 1:
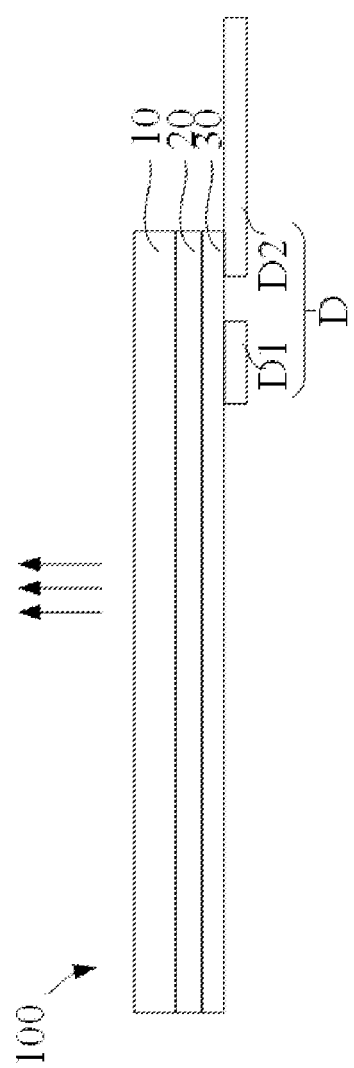
FIG. 1 is a schematic structural diagram of a display device according to a first embodiment of the present application.

The technical solutions in the present application will be clearly and completely described below in conjunction with the drawings in the implementation manners of the present application. Obviously, the described implementation manners are only a part of the implementation manners of the present application, rather than all of the implementation manners. Based on the implementation in the present application, all other implementations obtained by those skilled in the art without creative work fall within the protection scope of the present application.

In the present application, unless expressly stipulated and defined otherwise, the first feature "on" or "under" the second feature may include the first and second features directly, or include the first and second features. The direct connection is through the contact of another feature between them. Moreover, "upon", "on" and "above" the second feature of the first feature include the first feature being directly above and obliquely above the second feature, or merely indicating that the level of the first feature is higher than that of the second feature. The "below," "under" and "underneath" of the second feature of the first feature include the first feature directly below and obliquely below the second feature, or it simply means that the level of the first feature is smaller than the second feature. In addition, the terms "first" and "second" are only used for descriptive purposes, and cannot be understood as indicating or implying relative importance or implicitly indicating the number of indicated technical features. Thus, features defining "first" or "second" may include one or more of the described features either explicitly or implicitly.

The present application provides a display device. The display device can be an electronic equipment having display function such as a mobile phone, a tablet, a desktop computer, a laptop, an e-reader, a handheld computer, an electronic display screen, a notebook, an ultra-mobile personal computer (UMPC), a netbook, a cellular phones, a personal digital assistant (PDA), an augmented reality (AR)

virtual reality (VR) devices, a media player, a wearable device, a digital camera, a car navigator, etc.

The display device provided by an embodiment of the present application includes a support substrate, a light-emitting chip, and a thin film transistor, wherein the light-emitting chip is disposed on a side of the support substrate. The thin film transistor is disposed on a side of the light emitting chip away from the support substrate, and the thin film transistor is connected to the light-emitting chip. The display device of the present application may form the light-emitting chip on the support substrate, and then use a photolithography process to form the thin film transistor for driving on the light-emitting chip. Compared with the prior art, the display device of the present application does not need to use anisotropic conductive film (ACF) bonding process or metal bonding process, only through the photolithography process instead, to firmly bond the light-emitting chip and a thin film transistor array support substrate, which improves the bonding stability and thus the process yield.

Hereinafter, specific implementations of the present application will be described in detail with reference to the drawings.

Please refer to FIG. 1, the display device 100 according to the first embodiment of the present application includes a support substrate 10, a light-emitting layer 20, a thin film transistor layer 30, and a drive component D stacked in sequence. Specifically, the light-emitting layer 20 is disposed on a side of the support substrate 10. The thin film transistor layer 30 is disposed on a side of the light-emitting layer 20 away from the support substrate 10, and the thin film transistor layer 30 is connected to the light-emitting layer 20. The drive component D is disposed on a side of the thin film transistor layer 30 away from the light-emitting layer 20 and is connected to the thin film transistor layer 30. The drive component D is configured to drive a thin film transistor 31 and a light-emitting chip 21. The drive component D may include a driver chip D1 and a flexible circuit board D2. The drive component D of the present application is directly disposed on a back surface of the support substrate 10, which is beneficial to realize a narrow bezel. In the present embodiment, a light emitting direction of the display device 100 is a direction from the light-emitting layer 20 pointing to the support substrate 10. Please refer to FIG. 2, it should be noted that, in order to facilitate the description of the structure of the display device 100 of the embodiment of the present application, The display device 100 in FIG. 1 is inverted in FIG. 2 for illustration. In addition to the support substrate 10, the light-emitting layer 20, the thin film transistor layer 30, and the drive component D shown in FIG. 1, the display device 100 further includes a first signal transmission electrode E1, a second signal transmission electrode E2, a first drive electrode 40, a second drive electrode 50, a flat layer 60, a first passivation layer 70, and a second passivation layer 80. The first signal transmission electrode E1 and the second signal transmission electrode E2 are disposed on the side of the light-emitting layer 20 away from the support substrate 10. The first drive electrode 40 is disposed on the side of the light-emitting layer 20 away from the support substrate 10 and is arranged spaced apart from the thin film transistor 31. The second drive electrode 50 is disposed on a side of the light-emitting layer 20 close to the support substrate 10. The flat layer 60 is disposed between the light-emitting layer 20 and the thin film transistor 31 and the first drive electrode 40. The first passivation layer 70 is disposed on the side of the thin film transistor layer 30 away from the light-emitting layer 20. The second passivation layer 80 is located on a side of the first signal transmission electrode E1 away from the first passivation layer 70.

Specifically, the support substrate 10 may be a rigid substrate such as a glass substrate or a plastic substrate, or may be a flexible substrate. The support substrate 10 can support the light-emitting layer 20 and the thin film transistor layer 30. In some embodiments, the support substrate 10 can also serve as a cover plate for the light-emitting layer 20 and the thin film transistor layer 30. It should be understood that a glue layer may also be disposed between the support substrate 10 and the light-emitting layer 20 layer.

The light-emitting layer 20 includes at least one light-emitting chip 21. The at least one light-emitting chip 21 may be arranged on the support substrate 10 in an array form. The light-emitting chip 21 may be a micro-light-emitting diode (Micro-LED) chip or a mini light-emitting diode (Mini-LED) chip. In the present embodiment, the light-emitting chip 21 is a Micro-LED chip. Optionally, the light-emitting chip 21 is a vertical type chip. Specifically, the light-emitting chip 21 includes a first electrode 211, a second electrode 212, and a chip light-emitting layer 213. The first electrode 211 is located on a side of the second electrode 212 away from the support substrate 10. The chip light-emitting layer 213 is located between the first electrode 211 and the second electrode 212. Optionally, the first electrode 211 is a P-type electrode, and the second electrode 212 is an N-type electrode.

The flat layer 60 fills up a step of the light-emitting chip 21. In other words, the flat layer 60 covers the light-emitting chip 21. The flat layer 60 is configured to form a flat surface on the light-emitting chip 21 to facilitate the formation of the thin film transistor 31 in the subsequent photolithography process. The flat layer 60 may be one or more organic layers or inorganic layers. In the present embodiment, the flat layer 60 includes an organic layer 61 and an inorganic layer 62 disposed on a side of the organic layer 61 away from the light-emitting layer 20. Optionally, the flat layer 60 serves as an encapsulation layer of the light-emitting chip 21 by encapsulating the light-emitting chip 21. It is equivalent to that the display device 100 of the present application is provided with the encapsulation layer of the light-emitting chip 21, and no additional packaging process is required, which can effectively shorten the tack time and maximize the production efficiency.

The thin film transistor layer 30 is configured to drive the light-emitting layer 20. The thin film transistor layer 30 includes at least one thin film transistor 31. Specifically, the thin film transistor 31 is a drive transistor. The thin film transistor layer 30 may also include a switching transistor (not shown) and the like. In order to facilitate power supply to the light-emitting chip 21, an orthographic projection of the thin film transistor 31 on the plane where the light-emitting layer 20 is located is staggered from the light-emitting chip 21, that is, does not overlap. The thin film transistor 31 is a double gate thin film transistor 31. The thin film transistor 31 includes an active layer CL, a first gate insulating layer GI1, a first gate electrode GE1, a second gate insulating layer GI2, a second gate electrode GE2, an interlayer insulation layer IL, a source SE, and a drain DE, which are sequentially stacked. Specifically, the active layer CL is disposed on the light-emitting layer 20, the first gate insulating layer GI1 covers a side of the active layer CL away from the light-emitting layer 20. The first gate electrode GE1 is disposed on a side of the first gate insulating layer GI1 away from the active layer CL. The second gate insulating layer GI2 covers the first gate electrode GE1 and the first gate insulating layer GI1. The second gate electrode GE2 is disposed on a side of the first gate insulating layer GI1 away from the first gate electrode GE1. The second gate electrode GE2 is disposed corresponding to the first gate electrode GE1 and the active layer CL. The interlayer insulation layer IL covers the second gate electrode GE2 and the second gate insulating layer GI2. The source SE and the drain DE are disposed on a side of the interlayer insulation layer IL away from the second gate electrode GE2, and are respectively connected to two ends of the active layer CL. The source of the thin film transistor 31 is connected to the first signal transmission electrode E1, and the drain is connected to the first electrode 211. It should be noted that among the first gate electrode GE1 and the second gate electrode GE2, the first gate electrode GE1 is configured to control the opening and closing of the active layer CL. The second gate electrode GE2 is configured to form a storage capacitor with the first gate electrode GE1. That is, the second gate electrode GE2 and the first gate electrode GE1 are respectively two plates of the storage capacitor. When the display device 100 is displaying, a scan signal is provided to the first gate electrode GE1, and a Vi signal or a VDD signal is provided to the second gate electrode GE2.

Figure 2:
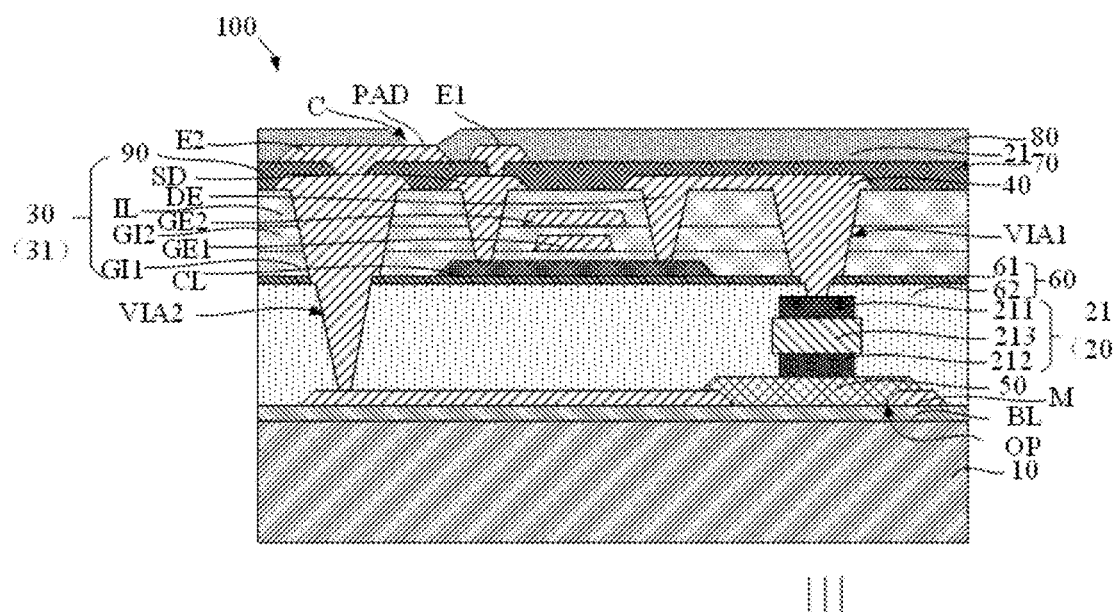
FIG. 2 is a schematic partial cross-sectional view of the display device of FIG. 1.

The transistors used in all the embodiments of the present application can be thin film transistors or field effect transistors or other devices with the same characteristics. Since the source and drain of the transistors used here are symmetrical, the source and drain can be interchanged of. In the embodiments of the present application, in order to distinguish the two electrodes of the transistor other than the gate electrode, one of the electrode is referred to as the source and the other is referred to as the drain. According to the form in the figure, it is stipulated that the middle end of the switching transistor is the gate electrode, the signal input end is the source, and the output end is the drain. In addition, the transistors used in the embodiments of the present application may include P-type transistors and/or n transistors. The P-type transistor is turned on when the gate electrode is at a low level, and turned off when the gate electrode is at a high level; and the n transistor is turned on when the gate electrode is at a high level, and turned off when the gate electrode is at a low level. It should be understood that the present application does not limit the structure of the thin film transistor 31 included in the thin film transistor layer 30. It can be a top gate thin film transistor or a bottom gate thin film transistor, and it can be a double gate thin film transistor as shown in FIG. 2. The thin film transistor may also be a single gate thin film transistor. The specific structure of the thin film transistor will not be repeated in the present application.

The first passivation layer 70 covers the thin film transistor layer 30 to protect the thin film transistor layer 30 and facilitate subsequent formation of the first signal transmission electrode E1 and the second signal transmission electrode E2.

The first signal transmission electrode E1 is configured to transmit the VDD signal. The first signal transmission electrode E1 may be disposed on a side of the thin film transistor 31 away from the light-emitting chip 21. The first signal transmission electrode E1 is connected to the source SE. Since the first signal transmission electrode E1 is to be connected to the source SE, it is preferable that the first signal transmission electrode E1 is disposed directly above the source SE and connected to the source SE through a via. In addition, the VDD traces can be formed into a meshed shape, and the meshed VDD traces are connected to the source of each thin film transistor, so that the VDD voltage of the source of each thin film transistor is basically the same, thereby reducing the IR drop. The meshed shape is not limited to a vertical meshed shape, an inclined meshed shape, or a meshed shape formed by interweaving curves. The first signal transmission electrode E1 may be made of a metal material or a transparent conductive material.

The first drive electrode 40 is connected between the drain DE of the thin film transistor 31 and the first electrode 211. Further, the first drive electrode 40 is arranged in the same layer as the drain DE and the source SE of the thin film transistor 31, and is directly connected to the drain DE. The first drive electrode 40 is configured to connect to the first electrode 211. Therefore, the first drive electrode 40 may be disposed corresponding to the first electrode 211 and spaced apart from the thin film transistor 31. The display device 100 is provided with a first via VIAL The first via VIAL penetrates the interlayer insulation layer IL, the second gate insulating layer GI2, the first gate insulating layer GI1, and a portion of the flat layer 60 to expose a surface of the first electrode 211. The first drive electrode 40 is filled in the first via VIAL and connected to the first electrode 211.

The second signal transmission electrode E2 is configured to transmit the VSS signal. The second signal transmission electrode E2 may also be disposed on the side of the thin film transistor 31 away from the light-emitting chip 21. The second signal transmission electrode E2 is connected to the second drive electrode 50. Optionally, the second signal transmission electrode E2 may be arranged in the same layer as the first signal transmission electrode E1. The second signal transmission electrode E2 is insulated from the first signal transmission electrode E1. Accordingly, the second signal transmission electrode E2 can also be disposed on a different layer from the first signal transmission electrode E1. For example, the second signal transmission electrode E2 is disposed on the first passivation layer 70, and the second signal transmission electrode E2 is disposed on the same layer as the source SE.

The second drive electrode 50 is connected between the second signal transmission electrode E2 and the second electrode 212. The second drive electrode 50 may be located directly under the light-emitting layer 20.

Optionally, the second drive electrode 50 is a transparent electrode, and the material of the transparent electrode is, for example, indium tin oxide (ITO). The display device 100 further includes a metal electrode M. The metal electrode M is disposed between the support substrate 10 and the light-emitting chip 21. The metal electrode M is provided with an opening OP. The second drive electrode 50 is disposed in the opening OP and is electrically connected to the metal electrode M. By setting the second drive electrode 50 as a transparent electrode, the light emitted by the light-emitting chip 21 can be emitted from the second drive electrode 50 to perform display. The orthographic projection of the active layer CL of the thin film transistor 31 on the plane where the metal electrode M is located overlaps the metal electrode M, so that the metal electrode M can be configured as a light shielding layer of the active layer CL to block the influence of ambient light on the active layer CL. It should be understood that the metal electrode M and the second drive electrode 50 in the present application can also be replaced by a monolithic transparent electrode. In this case, the fabricating process can be simplified. A buffer layer BL may also be disposed between the metal electrode M and the support substrate 10. The buffer layer BL may be configured to enhance the adhesion between the support substrate 10 and the metal electrode M. The buffer layer BL may be an inorganic layer or an organic layer. When the second drive electrode 50 is a monolithic transparent electrode, the buffer layer BL may be omitted.

The display device 100 further includes a connecting electrode 90 connected between the second signal transmission electrode E2 and the second drive electrode 50. Since the second drive electrode 50 is located directly under the light-emitting layer 20, the second signal transmission electrode E2 is located above the light-emitting layer 20 so that needs to pass through the connecting electrode 90 provided in the via. The display device 100 is provided with a second via VIA2. The second via VIA2 penetrates the interlayer insulation layer IL, the second gate insulating layer GI2, the first gate insulating layer GI1, and a portion of the flat layer 60 to expose a surface of the metal electrode M. The connecting electrode 90 is filled in the second via VIA2 and connected to the metal electrode M, thereby being connected to the second drive electrode 50. The connecting electrode 90 can be arranged in the same layer as the source SE and the drain DE and formed by the same process. However, since the depth of the second via VIA2 is too large, the connecting electrode 90 may be formed by depositing multiple layers of metal. The connecting electrode 90 may be located on a side of the thin film transistor 31 away from the first drive electrode 40, or may be located on a side of the thin film transistor 31 close to the first drive electrode 40.

The second passivation layer 80 covers the first signal transmission electrode E1 and the second signal transmission electrode E2, and serves as a protective layer for the first signal transmission electrode E1 and the second signal transmission electrode E2. In addition, a groove C may be disposed in the second passivation layer 80, and the groove C exposes a surface of the second signal transmission electrode E2. The exposed surface of the second signal transmission electrode E2 can be configured as a pin for connecting the drive component D.

The working principle of the display device 100 of the present application is as follows:

The drive component D provides the VDD signal to the first signal transmission electrode E1, and the first signal transmission electrode E1 transmits the VDD signal to the source SE of the thin film transistor 31. The drive component D provides scanning signals and data signals to the switching transistor. The data signals are transmitted to the thin film transistor 31 (drive transistor) through the switching transistor. The data signals charge the storage capacitor and maintain the high potential of the first gate electrode GE1 to turn on the thin film transistor 31. The VDD signal is transmitted to the first drive electrode 40, and the first drive electrode 40 applies the VDD signal to the first electrode 211 of the light-emitting chip 21. On the other hand, the drive component D provides the VSS signal to the second signal transmission electrode E2. The second signal transmission electrode E2 transmits the VSS signal to the metal electrode M and the second drive electrode 50 electrically connected to the metal electrode M through the connecting electrode 90. The second drive electrode 50 applies the VSS signal to the second electrode 212 of the light-emitting chip 21. Under the combined action of the VDD signal and the VSS signal, the light-emitting chip 21 emits light.

Figure 3:
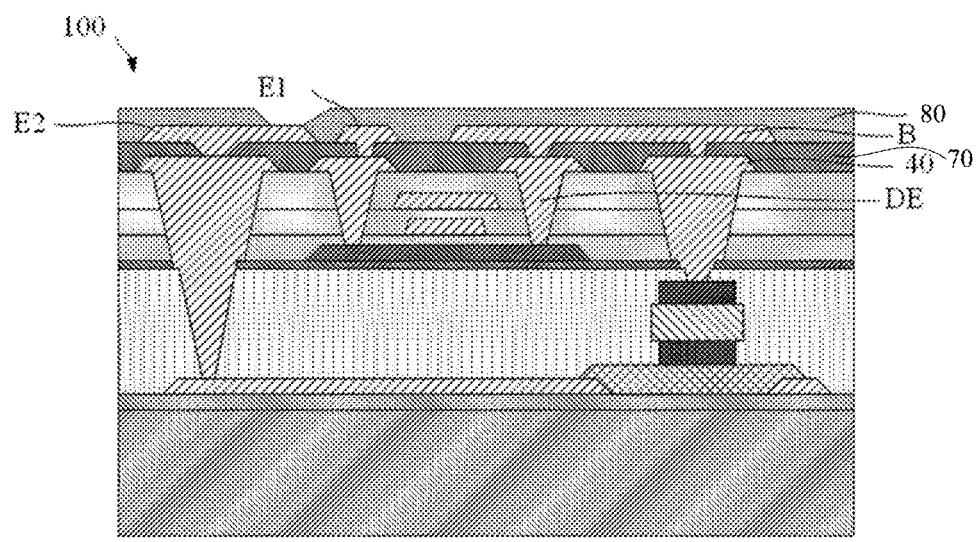
FIG. 3 is a schematic partial cross-sectional view of a display device according to a second embodiment of the present application.

Please refer to FIG. 3, the structure of a display device 100 of the second embodiment of the present application is different from that of the first embodiment in that a drain DE and a first drive electrode 40 are arranged in the same layer, but are not directly connected. The display device 100 further includes a bridging electrode B, and the bridging electrode B and a VDD are arranged in the same layer. The bridging electrode B connects the drain DE and the first drive electrode 40. As shown in FIG. 3, the bridging electrode B is respectively connected to the drain DE and the first drive electrode 40 through two vias opened in the first passivation layer 70. In the present embodiment, the electrode on the same layer as the VDD is configured as the bridging electrode B to connect the drain DE and the first drive electrode 40.

Figure 4:
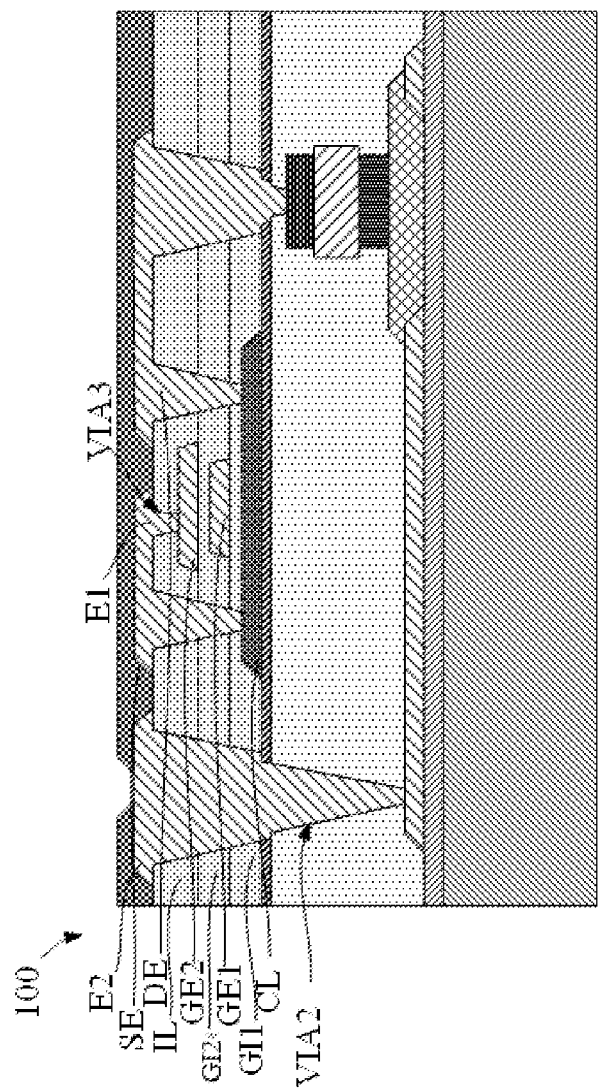
FIG. 4 is a schematic partial cross-sectional view of a display device according to a third embodiment of the present application.

Please refer to FIG. 4, the structure of a display device 100 of the third embodiment of the present application is different from that of the first embodiment in that: a first signal transmission electrode E1 and a second signal transmission electrode E2 are arranged in the same layer as a source SE, and the first signal transmission electrode E1 is connected between the source SE and a second gate electrode GE2. The source SE, the first signal transmission electrode E1, and the second gate electrode GE2 form a three-dimensional meshed VDD trace structure. When the display device 100 is displaying, the first signal transmission electrode E1 simultaneously provides the source SE of the thin film transistor and the second gate electrode GE2 with VDD voltages, respectively, which reduces the IR drop on the display device 100, and can also charge the storage capacitor formed with a first gate electrode GE1 and the second gate electrode GE2 to maintain the first gate electrode GE1 in a high potential. In the third embodiment, the connecting electrode 90 in the first embodiment serves as the second signal transmission electrode E2. The second signal transmission electrode E2 is filled in the second via VIA2 and is connected to the metal electrode M, thereby being connected to the second drive electrode 50. The display device 100 is also provided with a third via VIA3. The third via VIA3 penetrates the interlayer insulation layer IL to expose a surface of the second gate layer GE2. The first signal transmission electrode E1 is filled in the third via VIA3 to connect the second gate layer GE2.

In the present embodiment, the metal electrode M and the second passivation layer 80 above the source and drain can be omitted to save cost. By employing the source, the first signal transmission electrode E1, and the second gate electrode GE2 to form a three-dimensional meshed VDD trace structure, the IR drop can be reduced while the second gate electrode GE2 can be provided with voltage to maintain the first gate electrode GE1 in a high voltage.

It should be understood that in other embodiments of the present application, the first electrode 211 may be an N-type electrode, and the second electrode 212 may be a P-type electrode. Correspondingly, the positions of the first drive electrode 40, the second drive electrode 50, the thin film transistor 31, the first signal transmission electrode E1, and the second signal transmission electrode E2 can be appropriately adjusted according to the positions of the first electrode 211 and the second electrode 212, descriptions thereof are omitted herein.

The present application also provides a method for fabricating a display device including:

B01: providing a support substrate, and form a light-emitting chip on the support substrate.

B02: forming a thin film transistor on a side of the light emitting chip away from the support substrate, and connected to the light-emitting chip.

Before the step B01, it can also include:

B03: forming a buffer layer on the support substrate, and forming a second gate electrode on the buffer layer.

Between the steps B01 and B02, it can also include:

B04: detecting the light-emitting chip and repairing the light-emitting chip when it is judged to be a defective pixel.

After the step B02, it can also include:

B05: forming a flat layer on the light-emitting chip.

The following steps may be included after the step B02:

B05: forming a first signal transmission electrode and a second signal transmission electrode are formed on a thin film transistor layer.

Hereinafter, the method for fabricating a display device of the present application will be described in conjunction with a specific display device structure. The method for fabricating a display device of the fourth embodiment of the present application includes:

B11: forming a buffer layer BL on a support substrate 10.

In step B11, the support substrate 10 may be a rigid support substrate such as a glass support substrate, a plastic support substrate, or the like, or a flexible support substrate. The buffer layer BL may be an inorganic layer or an organic layer.

B04: forming a second drive electrode 50 is formed on the support substrate 10.

In the step B04, the second drive electrode 50 is a transparent electrode. In the step B04, a metal electrode M can be formed on the support substrate 10, an opening OP is formed in the metal electrode M by exposure, development, and etching. Then, a transparent electrode layer is formed in the opening OP, and the transparent electrode layer is patterned to form the second drive electrode 50.

In the present application, the metal electrode M and the second drive electrode 50 can also be replaced by a monolithic transparent electrode. In this case, the buffer layer BL can be omitted.

B11: providing the support substrate 10, forming a light-emitting chip 21 on the support substrate 10, and connecting a light-emitting electrode 21 to the second drive electrode 50.

Figure 5:
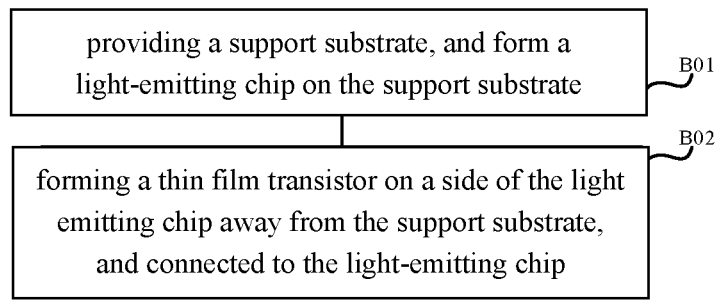
FIG. 5 is a flowchart of a method for fabricating a display device of the present application.
Figure 6:
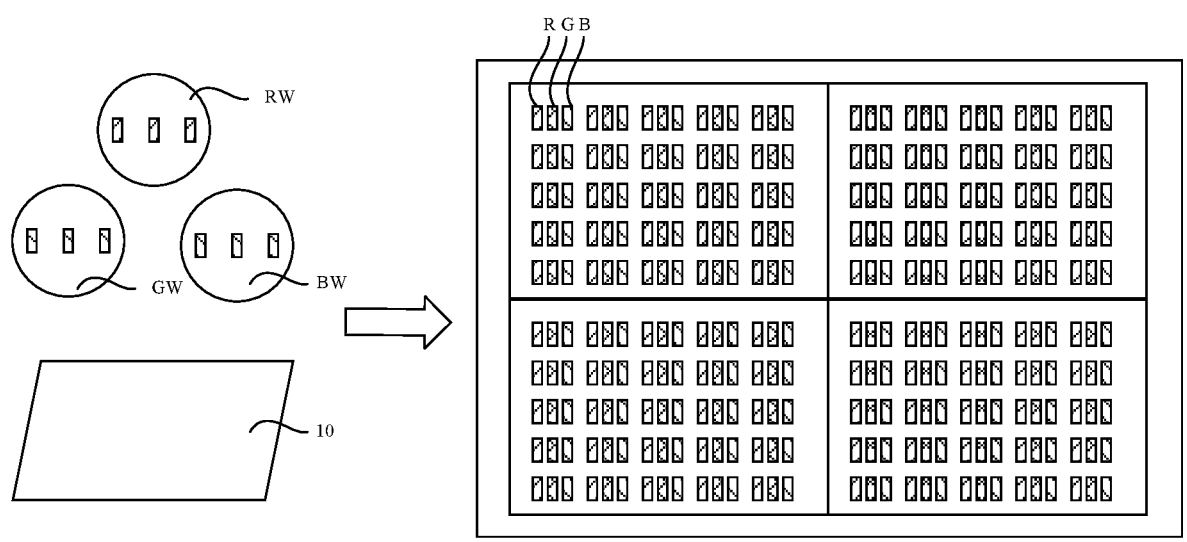
FIG. 6 is a schematic diagram of steps of transferring a light-emitting chip to a support substrate in the method for fabricating the display device of the present application.

In the step B11, at least one light-emitting chip 21 is formed on the support substrate 10. The at least one light-emitting chip 21 may be disposed on the support substrate in an array form to form the light-emitting layer 20. The light-emitting chip 21 may be a Micro-LED chip or a Mini-LED chip. The at least one light-emitting chip 21 is transferred to the support substrate through a mass transfer process. In the present embodiment, the light-emitting chip 21 is a Micro-LED chip. As shown in FIG. 5, the light-emitting chips 21 on a red wafer RW, a green wafer GW, and a blue wafer BW are transferred to the support substrate on which the second drive electrode 50 is formed. Red chips R, green chips G and blue chips B are arranged into a matrix package. Optionally, the light-emitting chip 21 is a vertical type chip. Specifically, the light-emitting chip 21 includes a first electrode 211, a second electrode 212, and a chip light-emitting layer 213. The first electrode 211 is located on a side of the second electrode 212 away from the support substrate 10. The chip light-emitting layer 213 is located between the first electrode 211 and the second electrode 212. The first electrode 211 is a P-type electrode, and the second electrode 212 is an N-type electrode. The second electrode 212 of the light-emitting chip 21 is connected to the second drive electrode 50.

In the step B11, it may also include detecting the light-emitting chip and repairing the light-emitting chip when it is judged to be a defective pixel.

B12: forming a flat layer 60 on the light-emitting chip 21.

The flat layer 60 fills up a step of the light-emitting chip 21. In other words, the flat layer 60 covers the light-emitting chip 21. The flat layer 60 is configured to form a flat surface on the light-emitting chip 21 to facilitate the formation of the thin film transistor 31 in the subsequent photolithography process. The flat layer 60 can be one or more organic or inorganic layers 62. Optionally, the flat layer 60 serves as an encapsulation layer of the light-emitting chip 21 by encapsulating the light-emitting chip 21. In the present embodiment, the flat layer 60 includes an organic layer 61 and an inorganic layer 62 disposed on a side of the organic layer 61 away from the light-emitting layer 20. The flat layer 60 in the present application covers the light-emitting chip 21 and can be configured as an encapsulation layer of the light-emitting chip 21.

B13: forming the thin film transistor 31 on the side of the light-emitting chip 21 away from the support substrate 10, and connecting the thin film transistor 31 and the light-emitting chip 21.

In the step B13, at least one thin film transistor 31 is formed, and the thin film transistor layer 30 is obtained.

It should be understood that since the thin film transistor 31 needs to be electrically connected to the light-emitting chip 21, and the thin film transistor 31 and the light-emitting chip 21 are located in different layers, in order to facilitate power supply to the light-emitting chip 21, an orthographic projection of the thin film transistor 31 on the plane where the light-emitting layer 20 is located is staggered from the light-emitting chip 21, that is, does not overlap. The thin film transistor 31 is a double gate thin film transistor 31. The thin film transistor 31 includes an active layer CL, a first gate insulating layer GI1, a first gate electrode GE1, a second gate insulating layer GI2, a second gate electrode GE2, an interlayer insulation layer IL, a source SE, and a drain DE, which are sequentially stacked and arranged. Specifically, the active layer CL is disposed on the light-emitting layer 20, the first gate insulating layer GI1 covers a side of the active layer CL away from the light-emitting layer 20. The first gate electrode GE1 is disposed on a side of the first gate insulating layer GI1 away from the active layer CL. The second gate insulating layer GI2 covers the first gate electrode GE1 and the first gate insulating layer GI1. The second gate electrode GE2 is disposed on a side of the first gate insulating layer GI1 away from the first gate electrode GE1. The second gate electrode GE2 is disposed corresponding to the first gate electrode GE1 and the active layer CL. The interlayer insulation layer IL covers the second gate electrode GE2 and the second gate insulating layer GI2. The source SE and the drain DE are disposed on a side of the interlayer insulation layer IL away from the second gate electrode GE2, and are respectively connected to two ends of the active layer CL. The source of the thin film transistor 31 is connected to the first signal transmission electrode E1, and the drain is connected to the first electrode 211.

B14: forming the first drive electrode 40 and the connecting electrode 90 on the flat layer 60, connecting the first drive electrode 40 to the first electrode 211, and connecting the connecting electrode 90 to the metal electrode M.

It should be understood that, in the step B14, the first drive electrode 40 and the connecting electrode 90 can be arranged in the same layer as the source SE and the drain DE of the thin film transistor 31; that is, they can be formed accompanying with the source SE and the drain DE of the thin film transistor 31 in the same process.

Specifically, before the source SE and the drain DE of the thin film transistor 31 are formed, a first via VIA1 is opened at a predetermined position, and the first via VIA1 penetrates the interlayer insulation layer IL, the second gate insulating layer GI2, and the first gate insulating layer GI1, and a portion of the flat layer 60 to expose a surface of the first electrode 211. The first drive electrode 40 is filled in the first via VIAL and connected to the first electrode 211. A second via VIA2 is opened at a predetermined position. The second via VIA2 penetrates the interlayer insulation layer IL, the second gate insulating layer GI2, the first gate insulating layer GI1, and a portion of the flat layer 60 to expose a surface of the metal electrode M. The connecting electrode 90 is filled in the second via VIA2 and connected to the metal electrode M, thereby being connected to the second drive electrode 50. The connecting electrode 90 can be arranged in the same layer as the source electrode and the drain electrode and formed by the same process. However, since the depth of the second via VIA2 is too large, the connecting electrode 90 may be formed by depositing multiple layers of metal. The connecting electrode 90 may be located on a side of the thin film transistor 31 away from the first drive electrode 40, or may be located on a side of the thin film transistor 31 close to the first drive electrode 40.

B15: forming a first passivation layer 70 on the thin film transistor 31.

In the step B15, two openings are opened in the first passivation layer 70 to expose the connecting electrode 90 and the source SE.

B16: forming the first signal transmission electrode E1 and the second signal transmission electrode E2 on the first passivation layer 70, connecting the first signal transmission electrode E1 to the source SE of the thin film transistor 31, and connecting the second signal transmission electrode E2 to the metal electrode M.

In the step B16, a metal electrode is deposited on the first passivation layer 70, and the metal electrode is patterned to form a first signal transmission electrode E1 and a second signal transmission electrode E2. The second signal transmission electrode E2 may be insulated from the first signal transmission electrode E1. The first signal transmission electrode E1 is connected to the source SE through a via. In addition, a VDD traces can be formed into a meshed shape to reduce the IR drop. The meshed shape is not limited to a vertical meshed shape, an inclined meshed shape, or a meshed shape formed by interweaving curves. The first signal transmission electrode E1 may be made of a metal material. The second signal transmission electrode E2 is connected to the connecting electrode 90 through a via.

B17: forming a second passivation layer 80 on the first signal transmission electrode E1 and the second signal transmission electrode E2.

The second passivation layer 80 is formed on the first signal transmission electrode E1 and the second signal transmission electrode E2 to protect the first signal transmission electrode E1 and the second signal transmission electrode E2. In addition, a groove C may be formed in the second passivation layer 80, and the groove C exposes a surface of the second signal transmission electrode E2. The exposed surface of the second signal transmission electrode E2 can be configured as a pin for connecting to the drive component 40. After the step B17, the display device shown in FIG. 2 of the present application is obtained.

The method for fabricating the display device may further include bonding the drive component 40.

Please refer to FIG. 3, the method for fabricating a display device of the fifth embodiment of the present application has steps B11 to B13, and B17 the same as that of the fourth embodiment. The difference is that:

B14: forming a first drive electrode 40 and a connecting electrode 90 on a flat layer 60, the first drive electrode 40 is connected to the first electrode 211, and the connecting electrode 90 is connected to the metal electrode M.

In the step B14, a drain DE and the first drive electrode 40 are arranged in the same layer, but are not directly connected.

B15: forming a first passivation layer 70 on the thin film transistor 31.

In the step B15, a plurality of openings are opened in the first passivation layer 70 to expose the connecting electrode 90, a source SE, the drain DE, and the first drive electrode 40.

B16: forming a first signal transmission electrode E1, a second signal transmission electrode E2, and a bridging electrode B on a light-emitting layer 20, connecting the first signal transmission electrode E1 to the source SE of the thin film transistor 31, connecting the second signal transmission electrode E2 to the metal electrode M, and connecting the bridging electrode B to the drain DE and the first drive electrode 40.

Please refer to FIG. 4, the method for fabricating a display device of the sixth embodiment of the present application has steps B11 to B13 the same as that of the fourth embodiment. The difference is that:

B14: forming a first drive electrode 40, a first signal transmission electrode E1, and a second signal transmission electrode E2 on a flat layer 60, connecting the first drive electrode 40 to a first electrode 211, and connecting the second signal transmission electrode E2 to a metal electrode M.

It should be understood that the first drive electrode, the first signal transmission electrode E1, and the second signal transmission electrode E2 in the step B14 can be arranged in the same layer as the source SE and drain DE of the thin film transistor 31; that is, they can be formed accompanying with the source SE and the drain DE of the thin film transistor 31 in the same process.

Specifically, before the source SE and the drain DE of the thin film transistor 31 are formed, a first via VIA1 is opened at a predetermined position, and the first via VIA1 penetrates the interlayer insulation layer IL, the second gate insulating layer GI2, and the first gate insulating layer GI1, and a portion of the flat layer 60 to expose a surface of the first electrode 211. The first drive electrode 40 is filled in the first via VIA1 and connected to the first electrode 211. A second via VIA2 is opened at a predetermined position. The second via VIA2 penetrates the interlayer insulation layer IL, the second gate insulating layer GI2, the first gate insulating layer GI1, the passivation layer, and a portion of the flat layer 60 to expose a surface of the metal electrode M. The second signal transmission electrode E2 is filled in the second via VIA2 and is connected to the metal electrode M, thereby being connected to the second drive electrode 50. The second signal transmission electrode E2 can be arranged in the same layer as the source and the drain and formed by the same process. However, since the depth of the second via VIA2 is too large, the second signal transmission electrode E2 may be formed by depositing multiple layers of metal. A third via VIA3 is opened at a predetermined position. The third via VIA3 penetrates the interlayer insulation layer IL to expose a surface of the second gate electrode GE2. The first signal transmission electrode E1 is filled in the third via VIA3 to connect to the second gate electrode GE2.

B15: forming a first passivation layer 70 on the thin film transistor 31.

In the step B15, two openings are opened in the first passivation layer 70 to expose the second signal transmission electrode E2.

In the present embodiment, the metal electrode M and the second passivation layer 80 above the source and the drain can be omitted to save cost. By employing the source, the first signal transmission electrode E1, and the second gate electrode GE2 to form a three-dimensional meshed VDD trace structure, the IR drop can be reduced.

It should be understood that the above-mentioned order of steps for the method is only for illustration, and the steps of the method of the present invention are not limited to the order specifically described above, unless otherwise specified.

The above provides a detailed introduction to the implementation of the application, and specific examples are used in this article to illustrate the principles and implementations of the application, and the description of the implementations above is only used to help understand the application. At the same time, for those skilled in the art, according to the idea of the application, there will be changes in the specific implementation and the scope of application. In summary, the content of this specification should not be construed as a limitation to the application.

What is claimed is:

1. A display device comprising:
   a support substrate;
   a light-emitting chip disposed on a side of the support substrate, wherein the light-emitting chip comprises a first electrode and a second electrode, and the first electrode is located on a side of the second electrode away from the support substrate;
   a thin film transistor disposed on a side of the light-emitting chip away from the support substrate and connected to the light-emitting chip, wherein the thin film transistor comprises a source and a drain; and
   a first signal transmission electrode disposed on the side of the light-emitting chip away from the support substrate, wherein the source is connected to the first signal transmission electrode, and the drain is connected to the first electrode.

2. The display device of claim 1, wherein the first signal transmission electrode is disposed on a side of the thin film transistor away from the light-emitting chip, the display device comprises a first drive electrode disposed on the side of the light-emitting chip away from the support substrate, arranged spaced apart from the thin film transistor, and connected between the drain and the first electrode.

3. The display device of claim 2, wherein the first drive electrode is arranged in the same layer as the drain and directly connected to the drain.

4. The display device according to claim 2, wherein the display device further comprises a bridging electrode arranged in the same layer as the first signal transmission electrode, and connecting the drain and the first drive electrode.

5. The display device of claim 1, wherein the thin film transistor further comprises a first gate and a second gate disposed on a side of the first gate away from the light-emitting chip, the source and the drain are disposed on a side of the second gate away from the light-emitting chip, the first signal transmission electrode and the source are arranged in the same layer, and the first signal transmission electrode is connected between the source and the second gate.

6. The display device of claim 1, wherein the display device comprises a second signal transmission electrode disposed on the side of the light-emitting chip away from the support substrate, and connected to the second electrode.

7. The display device of claim 6, wherein the second signal transmission electrode is disposed on a side of the thin film transistor away from the light-emitting chip; or
   the second signal transmission electrode and the source electrode are arranged in the same layer.

8. The display device of claim 6, wherein the display device comprises a second drive electrode disposed on a side of the light-emitting chip close to the support substrate, and connected between the second signal transmission electrode and the second electrode.

9. The display device of claim 8, wherein the display device comprises a connecting electrode connected between the second signal transmission electrode and the second drive electrode.

10. The display device of claim 8, wherein the second drive electrode is disposed corresponding to the second electrode and is a transparent electrode, the display device comprises a metal electrode disposed between the support substrate and the light-emitting chip and provided with an opening, the second drive electrode is disposed in the opening and electrically connected to the metal electrode, and the display device comprises a connecting electrode connected between the second signal transmission electrode and the metal electrode.

11. The display device of claim 10, wherein the thin film transistor comprises an active layer having an orthographic projection overlapping with the metal electrode on a plane where the metal electrode is located.

12. The display device of claim 6, wherein the second signal transmission electrode and the first signal transmission electrode are arranged in the same layer.

13. The display device of claim 3, wherein the display device comprises a second signal transmission electrode disposed on the side of the light-emitting chip away from the support substrate and connected to the second electrode;
   the second signal transmission electrode is disposed on the side of the thin film transistor away from the light-emitting chip; or
   the second signal transmission electrode and the source are arranged in the same layer.

14. The display device of claim 13, wherein the display device comprises a second drive electrode, a connecting electrode and a metal electrode, the second drive electrode is disposed on a side of the light-emitting chip close to the support substrate, the second drive electrode is connected between the second signal transmission electrode and the second electrode, disposed corresponding to the second electrode, and is a transparent electrode;
   the connecting electrode is connected between the second signal transmission electrode and the second drive electrode; and
   the metal electrode is disposed between the support substrate and the light-emitting chip and provided with an opening, and the second drive electrode is disposed in the opening and is electrically connected to the metal electrode.

15. The display device of claim 4, wherein the display device comprises a second signal transmission electrode disposed on the side of the light-emitting chip away from the support substrate and connected to the second electrode; and
   the second signal transmission electrode is disposed on the side of the thin film transistor away from the light-emitting chip; or the second signal transmission electrode and the source electrode are arranged in the same layer.

16. The display device of claim 5, wherein the display device comprises a second signal transmission electrode disposed on the side of the light-emitting chip away from the support substrate and connected to the second electrode; and the second signal transmission electrode is disposed on the side of the thin film transistor away from the light-emitting chip; or the second signal transmission electrode and the source are arranged in the same layer.

17. The display device of claim 16, wherein the display device comprises a second drive electrode, a connecting electrode and a metal electrode, the second drive electrode is disposed on a side of the light-emitting chip close to the support substrate, the second drive electrode is connected between the second signal transmission electrode and the second electrode, disposed corresponding to the second electrode, and is a transparent electrode;

the connecting electrode is connected between the second signal transmission electrode and the second drive electrode; and the metal electrode is disposed between the support substrate and the light-emitting chip and provided with an opening, and the second drive electrode is disposed in the opening and is electrically connected to the metal electrode.

18. The display device of claim 1, wherein the display device comprises a flat layer disposed between the light-emitting chip and the thin film transistor and encapsulating the light-emitting chip.

19. The display device of claim 1, wherein the display device further comprises a drive component disposed on a side of the thin film transistor away from the light-emitting chip and connected to the thin film transistor.

20. A display device comprising:
a support substrate;
a light-emitting chip disposed on a side of the support substrate, wherein the light-emitting chip comprises a first electrode and a second electrode, and the first electrode is located on a side of the second electrode away from the support substrate;
a thin film transistor disposed on a side of the light-emitting chip away from the support substrate and connected to the light-emitting chip, wherein the thin film transistor comprises a source and a drain;
a first signal transmission electrode disposed on the side of the light-emitting chip away from the support substrate, wherein the source is connected to the first signal transmission electrode, and the drain is connected to the first electrode;
a first drive electrode disposed on the side of the light-emitting chip away from the support substrate, arranged spaced apart from the thin film transistor, and connected between the drain and the first electrode; and
a second signal transmission electrode disposed on the side of the light-emitting chip away from the support substrate, and connected to the second electrode.

\* \* \* \* \*